United States Patent [19]

Lieber

[11] Patent Number: 5,196,396
[45] Date of Patent: Mar. 23, 1993

[54] METHOD OF MAKING A SUPERCONDUCTING FULLERENE COMPOSITION BY REACTING A FULLERENE WITH AN ALLOY CONTAINING ALKALI METAL

[75] Inventor: Charles M. Lieber, Lexington, Mass.

[73] Assignee: The President and Fellows of Harvard College, Cambridge, Mass.

[21] Appl. No.: 730,737

[22] Filed: Jul. 16, 1991

[51] Int. Cl.$^5$ .................. H01B 12/00; H01L 39/24; C01B 31/00
[52] U.S. Cl. .................................. 505/1; 505/725; 505/802; 505/811; 505/815; 252/500; 252/502; 423/414; 423/445 B; 423/900
[58] Field of Search ............... 505/1, 725, 802, 815, 505/810; 252/500, 502; 423/414

[56] References Cited

PUBLICATIONS

Kraus et al. "Superconductivity and NMR Investigations of KTI 1.5-doped $C_{60}$" Z. Phys. B, 85, 1-2, Oct. 1991.
McCavley et al., "Synthesis, Structure, and Superconducting Properties of Single-Phase $Rb_3C_{60}$" JACS, vol. 113, No. 22, Oct. 23, 1991.
Kelty et al., "Superconductivity at 30K in Calsium-doped $C_{60}$", Nature, vol. 352, pp. 223-225, Jul. 18, 1991.
Chen et al., "$(Rb_xK_{1-x})_3C_{60}$ Superconductors", Science vol. 253 pp. 886-888, Aug. 23, 1991.
Schirber et al., "Pressure Dependence of the Superconducting Transition Temperatue of Potassium Fullerene, $K_xC_{60}$", 1991, Physica C., vol. 179, pp. 137ff.
Phillips. J. C., "Theoretical Model of High-Temperature Superconductivity", unpublished.
Hebard, et al., "Superconductivity at 18 K in Potassium-Doped C60", Apr. 18, 1991, Nature, vol. 350, pp. 600-601.
Rosseinsky, et al., "Superconductivity at 28 K in RbxC60", May 27, 1991, Physical Review Letters, vol. 66, No. 21, pp. 2830-2832.

Holczer, et al., "Alkali-Fulleride Superconductors: Synthesis, Composition, and Diamagnetic Shielding", May 24, 1991, Science, vol. 252, pp. 1154-1157.
Kratschmer, et al., "Solid C60: A New Form of Carbon", Sep. 27, 1990, Nature, vol. 347, pp. 354-358.
Haufler, et al., "Efficient Production of C60 (Buckminsterfullerene), C60H36, and the Solvated Buckide Ion", 1990, J. Phys. Chem., vol. 94, No. 24, pp. 8634-8636.
Haddon, et al., "Experimental and Theoretical Determination of the Magnetic Susceptibility of C60 and C70", Mar. 7, 1991, Nature, pp. 46-47.
Diederich, et al., "The Higher Fullerenes: Isolation and Characterization of C76, C84, C90, C94, and C70O, an Oxide of D5h-C70", Apr. 26, 1991, Science, vol. 252, pp. 548-551.
Lagrange, "Grahpite-Alkali Metal-Heavy Metal Ternary Compounds: Synthesis, Structure, and Superconductivity", Nov./Dec. 1987, J. Mater. Res., vol. 2, No. 6, pp. 839-845.
Zhou, et al., "Structure and Bonding in Alkali-Metal-Doped C60", Jun. 6, 1991, Nature, vol. 351, pp. 462-464.
Weaver, et al., "Electronic Structure of Solid C60: Experiment and Theory", Apr. 1, 1991, Physical Review Letters, vol. 66, No. 13, pp. 1741-1744.

(List continued on next page.)

Primary Examiner—Paul Lieberman
Assistant Examiner—Bradley A. Swope
Attorney, Agent, or Firm—Choate, Hall & Stewart

[57] ABSTRACT

A method for making a superconducting fullerine composition, includes reacting a fullerine with an alloy, and particularly reacting $C_{60}$ with a binary alloy including an alkali metal or a tertiary alloy including two alkali metals in the vapor phase. Also, a Cesium-doped fullerine high $T_c$ superconducting composition has the formula $Cs_xC_{60}$, and particularly $Cs_3C_{60}$. Also, a homogeneous bulk single phase high $T_c$ superconducting composition has the formula $(Rb_xK_{1-x})_3C_{60}$.

16 Claims, 4 Drawing Sheets

OTHER PUBLICATIONS

Bausch, et al., "Diamagnetic Polyanions of the C60 and C70 Fullerenes: Preparation, 13C and 7 Li NMR Spectroscopic Observation, and Alkylation with Methyl Iodide to Polymethylated Fullerenes", 1991, *J. Am. Chem. Soc.*, vol. 113, pp. 3205-3206.

Duclos, et al., "Effects of Pressure and Stress on C60 Fullerite to 20 GPa", May 30, 1991, *Nature*, vol. 351, pp. 380-382.

Heiney, et al., "Orientational Ordering Transition in Solid C60", Jun. 3, 1991, *Physical Review Letters*, vol. 66, No. 22, pp. 2911-2914.

Williams, et al., "From Semiconductor-Semiconductor Transition (42 K) to the Highest-Tc Organic Superconductor, k-(ET)2Cu[N(CN)2]Cl(Tc=12.5K)", 1990, *Inorg. Chem.*, vol. 29, No. 18, pp. 3272-3274.

Haddon, et al., "Conducting Films of C60 and C70 by Alkali-Metal Doping", Mar. 28, 1991, *Nature*, vol. 350, pp. 320-322.

Stephens, et al., "Structure of Single-Phase Superconducting K3C60", Jun. 20, 1991, *Nature*, vol. 351, pp. 632-634.

Bardeen et al., *Theory of Superconductivity*, Dec. 1, 1957, *Phys. Rev.*, vol. 108, pp. 1175-ff.

Williams, et al., *From Semiconductor-Semiconductor Transition (42K) to the Highest-Tc Organic Superconductor*, 1990, *Inorg. Chem.*, vol. 29, pp. 3272-3274.

Sparn et al., *Pressure Dependence of Superconductivity in Single-Phase $K_3C_{60}$*, Jun. 28, 1991, *Science*, vol. 252, pp. 1829-1831.

FIG. 6

METHOD OF MAKING A SUPERCONDUCTING FULLERENE COMPOSITION BY REACTING A FULLERENE WITH AN ALLOY CONTAINING ALKALI METAL This invention relates to organic molecular superconductor compositions having high transition temperatures.

Significant effort has been directed recently toward understanding physical and chemical properties of $C_{60}$ and other large carbon clusters which together form a homologous series of hollow closed-caged molecules, known generally as "fullerenes".

A number of workers have reported superconducting Potassium- and Rubidium-doped $C_{60}$ solids and films having transition temperatures ["$T_c$"] significantly higher ($T_c^{Rb}=28$ K; $T_c^K=18$ K) than the $T_c$s of other known organic molecular superconductors (see, e.g., J. M. Williams et al. (1990), *Inorg. Chem.*, Vol. 29, pp.3272-74), suggesting that doped $C_{60}$ represents a distinct class of high $T_c$ organic molecular superconductor compositions.

A number of workers have attempted to obtain superconducting $C_{60}$ compositions by directly reacting $C_{60}$ with Cesium or Potassium or Rubidium vapor, see, e.g., A. F. Hebard et al. (1991), *Nature* (London), Vol. 350, pp. 600-601; M. J. Rosseinsky et al. (1991), *Phys. Rev. Lett.*, Vol. 66pp. 2830-32; and K. Holczer et al. (1991), *Science*, Vol. 252, pp. 1154-57. Reaction of K vapor with $C_{60}$ produced relatively large superconducting fractions ($K_3C_{60}$; see, e.g., Holczer et al., 1991), while reaction of Rb vapor with $C_{60}$ yielded much smaller superconducting fractions ($Rb_3C_{60}$; see, e.g., Holczer et al., 1991, Rosseinsky et al., 1991). $Cs_6C_{60}$ can be produced by direct reaction of Cs vapor with $C_{60}$, but this stoichiometry is significantly greater than that expected, on the basis of experience with the Rb-doped and the K-doped $C_{60}$s, to result in a superconducting phase. Attempts to obtain superconducting Cs-doped $C_{60}$ have failed.

SUMMARY OF THE INVENTION

I have discovered that high $T_c$ superconducting fullerene compositions can be produced by reacting a fullerene with an alloy, and particularly a binary alloy, that includes an alkali metal. Using the method according to the invention, the resulting high $T_c$ superconducting fraction can be produced in higher yield (approaching 100%, for example, reacting $C_{60}$ with a RbM alloy such as, for example RbHg or RbTl). The companion metal can apparently facilitate the incorporation of the alkali metal with the fullerene lattice. Moreover, I have discovered that reacting a fullerene with an alloy, and particularly a binary alloy (such as, for example, a CsM alloy) of an alkali metal, can produce high yields of high $T_c$ superconducting alkali metal-fullerene compositions that are difficult to obtain in a reaction of the fullerene with the alkali metal alone (such as, for example, $Cs_3C_{60}$). The companion metal can apparently suppress the high reactivity of the Cs in such reaction systems, so that the reaction has a reduced tendency to run to high, nonsuperconducting $Cs:C_{60}$ stoichiometries.

In one general aspect, the invention features a method for making a superconducting fullerene composition, comprising reacting a fullerine with an alloy.

In preferred embodiments, the fullerene includes $C_{60}$; the alloy is a binary alloy; the alloy includes an alkali metal, preferably K, Rb, or Cs, and the alloy further includes one of Hg, Tl, or Bi. Preferred alloys include CsM, where M is Hg (most preferably $CsHg_{1.1}$), Tl (most preferably $CsTl_2$), or Bi (most preferably CsBi); and RbM, where M is Hg or Tl.

In another general aspect, the invention features a superconducting composition having the formula $Cs_xC_{60}$.

In preferred embodiments the composition contains Cs and fullerene in a stoichiometric proportion approximately $Cs_{1.5-3}C_{60}$, more preferably approximately $Cs_3C_{60}$.

A Cs-doped fullerine composition according to the invention having the stoichiometric formula $Cs_xC_{60}$, where x is between about 1.5 and about 3, and produced using any of three different CsM precursors, can display reproducible superconductivity at 30 K as demonstrated by flux expulsion (Meissner effect) and flux exclusion (shielding) dc magnetization measurements.

I have further discovered that homogeneous bulk single phase superconducting $(Rb_xK_{1-x})_3C_{60}$ materials can be produced by reacting a $Rb_xK_{1-x}M$ alloy with $C_{60}$. For $x=1$, the stoichiometry of the superconducting phase is $Rb_3C_{60}$. Further, Rb and K form a continuously miscible solid solution with $C_{60}$ in such compositions, so that the Rb-doped and K-doped superconducting phases are apparently isostructural.

In another general aspect, the invention features a homogeneous bulk single phase superconducting $(Rb_xK_{1-x})_3C_{60}$ composition.

DESCRIPTION OF PREFERRED EMBODIMENTS

Drawings

The large value of flux expulsion (Meissner effect), which exceeds 50% of the ZFC value, indicates that the sample is a homogeneous bulk superconductor.

FIG. 5.1 is a plot showing the temperature dependence of magnetization recorded on powder samples of $(Rb_xK_{1-x})_3C_{60}$, for three values of x. Open circles, $x=0$; closed circles, $x=0.5$; closed triangles, $x=0.9$.

The low temperature shielding values for these ZFC curves show that the superconducting fraction is $\geq 35\%$.

FIG. 5.2 is a plot showing ZFC curves recorded over a limited temperature range to illustrate a systematic variation of $T_c$ with x in powder samples of $(Rb_xK_{1-x})_3C_{60}$. Curves labeled a, b, c, d, and e correspond respectively to values of x=0.1, 0.25, 0.5, 0.75, and 0.9.

Structure

High $T_c$ organic molecular superconducting compositions can be made according to the invention by reacting a metal alloy with a fullerene. The fullerene is produced, preferably by purification from a carbon soot, and then is exposed to the alloy. Detailed protocols follow, first showing production of $Cs_xC_{60}$ by exposing $C_{60}$ fullerene to CsM, and then showing up to 100% yield of $Rb_3C_{60}$ by exposing $C_{60}$ to an alloy of $RB_xK_{1-x}M$. The protocols are presented-by way of example. It will be appreciated that high $T_c$ superconducting fullerene compositions can be made according to the invention using fullerenes other than $C_{60}$, and using alloys other than the ones used in the examples. Particularly, alkali metals other than Cs can be used in the alloy, and other metals than Hg, Tl, or Bi can be used with the alkali metal in the alloy; and the proportions of metals in the alloy can be different from the proportions shown here.

Cesium-doped Fullerene $C_{60}$ was synthesized in a stainless steel chamber using high-purity graphite electrodes (99.9995%) generally as described in W. Kratschmer et al. (1990), *Nature*, Vol. 347, pp. 354–58 and in R. E. Haufler et al. (1990), *Jour. Phys. Chem.*, Vol. 94, pp. 8634–36. The carbon soot produced from an arc discharge in 100–150 torr of helium was extracted with benzene, and pure $C_{60}$ was obtained from this solution by chromatography on neutral alumina, generally as described in F. Diederich et al. (1991), *Science*, Vol. 252, pp. 548–51. The purification and isolation of $C_{60}$ were carried out in the dark to minimize impurities resulting from the photodegradation of $C_{60}$. The $C_{60}$ was then dried under vacuum for several hours (200°–250° C.) to remove solvent.

The $CsM_x$ (M=Hg, Tl, or Bi) and the $(CsM_x)_yC_{60}$ doped materials were made up in an inert atmosphere glove box equipped with an $O_2/H_2O$ removal system, and then sealed on a vacuum-line without exposing the samples to air.

Figure 1:
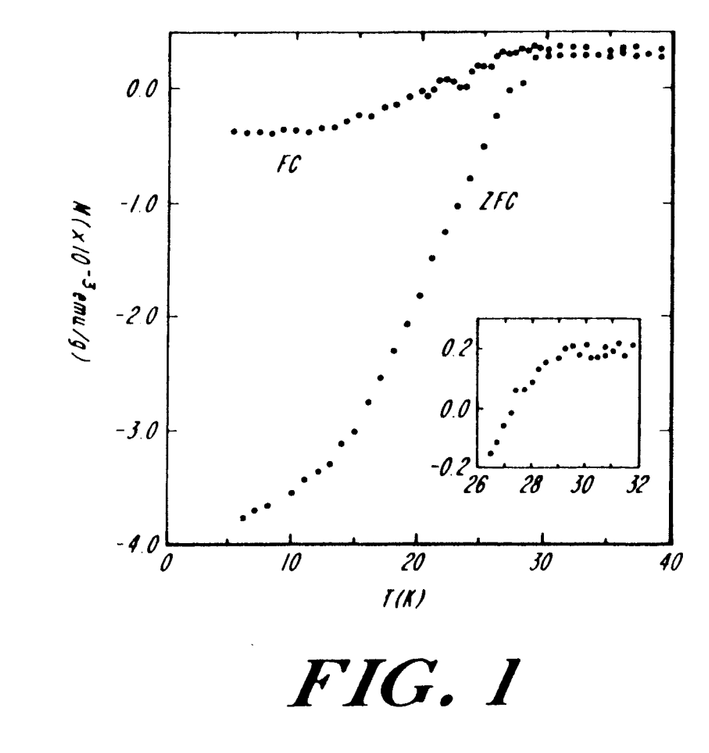
FIG. 1 is a plot showing the temperature dependence of the magnetization obtained for a $(CsTl_2)_{1.5}C_{60}$ sample after 1 h of reaction. The curves were obtained by cooling the sample in a zero field and subsequently warming it in a 50 Oe field ["ZFC" in the FIG.]; and by cooling the sample in a 50 Oe field ["FC"] from above $T_c$. The inset shows clearly the $T_c$ at 29.5 K.

FIG. 1 shows temperature-dependent magnetic susceptibility measurements obtained from a $(CsTl_2):C_{60}$ 1.5:1 sample using a superconducting quantum interference device ["SQUID"] magnetometer. The sample was made up from 10.3 mg of $CsTl_2$ and 11.4 mg of $C_{60}$, and was reacted at 220° C. After 1 hour of reaction, the zero field cooled curve obtained on warming the sample from 5 K in a field of 50 Oe exhibits a clear transition at 29.5 K. Above 29.5 K magnetic flux is no longer excluded from the sample. Additionally, on cooling the sample from 50 K in a 50 Oe field we observe flux expulsion from the sample (Meissner effect) with an onset at 29.5 K. The field cooled and zero field curves are completely stable to repeated cycling of the sample between 5 and 300 K. These flux expulsion and exclusion data are not consistent with any phenomenon other than superconductivity, and thus the transition is assigned to a $T_c$ of 29.5 K.

Figure 2:
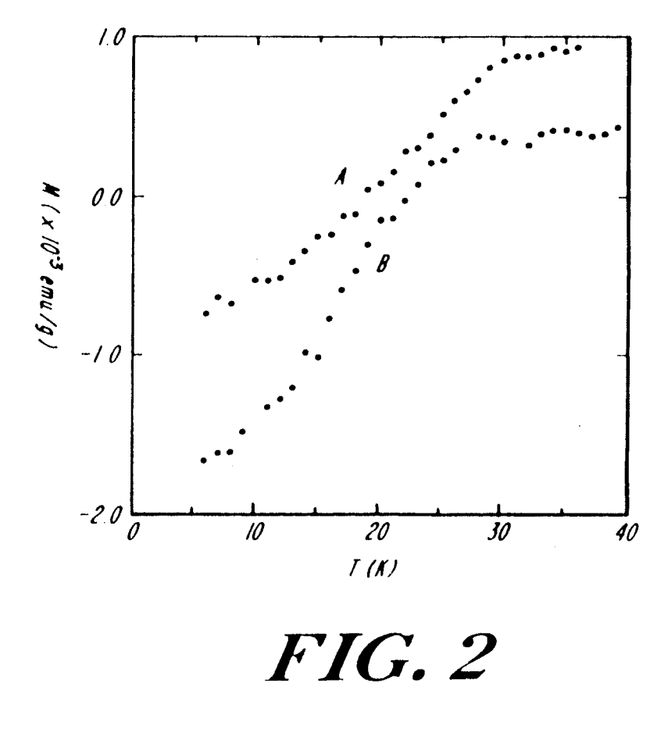
FIG. 2 is a plot showing zero field cooled magnetization versus temperature data obtained from a $(CsHg_{1.1})_3C_{60}$ sample after 1 h of reaction at 300° C. ["A"], and a $(CsBi)_3C_{60}$ sample after 1 h of reaction at 200° C. ["B"]. The curves were determined in a 50 Oe field.

Previous studies of graphite intercalation complexes ["GICs"] made from alkali metal-M alloys (M=Hg, Tl, Bi) have shown that these reactions lead to ternary GICs. See, P. Lagrange (1987), *Jour. Mater. Res.*, Vol. 2, pp. 839–45. Ternary $C_{60}$ compounds ($CsMC_{60}$) do not form under the reaction conditions according to the invention. Specifically, reactions of $C_{60}$ with $CsHg_{1.1}$ and CsBi alloys in a $CsM_x:C_{60}$ ratio of 3:1 leads reproducibly to the formation of superconducting compounds with $T_c$s of 29±1 K, as shown in FIG. 2.

Inasmuch as nearly the same $T_c$ is observed from $C_{60}$ reactions with $CsHg_{1.1}$, $CsTl_2$ and CsBi, it appears that the identical superconducting phase is formed in all three reactions and that this phase corresponds to $Cs_xC_{60}$.

Rb is present in the CsM alloy starting materials used in the specific examples above in amounts (<10 ppm) much smaller than could account for the observed superconducting fraction. Similar results are obtained from three different Cs alloys (i.e., CsHg, $CsTl_2$ and CsBi) prepared from three different sources of Cs. The observed $T_c$ is thus unlikely to be an effect of any Rb impurity in the doped fullerenes resulting from the preparation according to the invention. Moreover, magnetic measurements on independently prepared $Rb_3C_{60}$ samples show that the $T_c$ of the Rb-doped material (27–28 K) is 1–2 K lower than observed for Cs-doped $C_{60}$.

These observations indicate that the superconducting phase is less stable than the K- and Rb-doped superconductors, because these latter materials can be heated for at least two days without a decay of the superconducting phase. Measurements of the shielding signal as a function of reaction time indicate that 1–3 hours of reaction is optimal for the $CsHg_{1.1}$ (300° C.), $CsTl_2$ (200° C.) and CsBi (200° C.) alloys; longer reaction leads to progressive decreases in the yield of superconducting fraction. The instability of the Cs-doped $C_{60}$ superconducting phase is not unexpected, however, as direct reaction of Cs with $C_{60}$ fails to yield superconducting material.

It appears that formation of the $Cs_xC_{60}$ superconducting phase is kinetically favored in CsM alloy reactions, but that this phase undergoes a structural transformation to yield domains of the thermodynamically stable, but nonsuperconducting $Cs_6C_{60}$ compound that has been recently characterized by O. Zhou et al. (1991), *Nature*, Vol. 351, pp. 462–64.

The composition dependence of the $Cs_xC_{60}$ superconducting phase provides further insight into the stability and stoichiometry of this system. At increasing $CsTl_2$ to $C_{60}$ ratios greater than 3:1, the superconducting fraction is progressively reduced, and no superconducting material is detected at a 6:1 stoichiometry. For $CsTl_2$ and CsBi to $C_{60}$ ratios between 1.5:1 and 3:1 we obtain the superconducting phase in similar yields (about 1%), although the largest superconducting fractions have been obtained at the 3:1 stoichiometry. The optimum stoichiometry appears to be between 1.5:1 and 3:1 ($Cs:C_{60}$). By analogy with the $K_3C_{60}$ system, the superconducting Cs-doped fullerene can be expected to have a $Cs_3C_{60}$ stoichiometry. The low yield of superconducting phase is believed to be due to the transformation of this phase under the present reaction conditions to a nonsuperconducting one as discussed above.

Rb-doped fullerenes in high yield $C_{60}$ was formed, purified and isolated as described for Cs-doped fullerines in the Example above.

$Rb_xK_{1-x}Hg$ alloys were made by melting the desired ratio of high purity metals in a inert atmosphere glove box equipped with an $O_2/H_2O$ removal system. In general, samples were made by grinding the desired ratio of $C_{60}$ and $Rb_xK_{1-x}Hg$ in the glove box, and then sealing the resulting powder in a quartz tube on a vacuum line without exposure to air. The samples were heated isothermally (200°-250° C.) and the magnetization was determined as a function of time using a superconducting quantum interference device ["SQUID"] magnetometer (MPMS2, Quantum Design, San Diego, CA). Samples prepared in this way typically exhibit significant diamagnetic shielding (indicative of the superconducting phase) after a reaction time of about 1 hour. The superconducting fraction continues to increase with time, reaching a maximum after a reaction time of about 30-48 hours.

Figure 3:
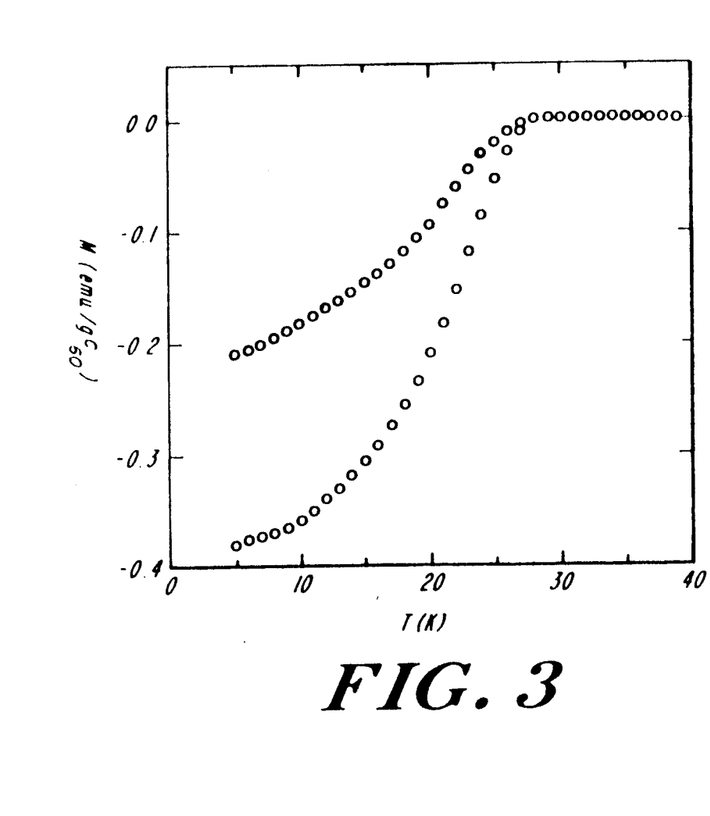
FIG. 3 is a plot showing the temperature dependence of the magnetization obtained for a $(RbHg)_3C_{60}$ sample. The curves were obtained as described for FIG. 1, and are correspondingly labelled.
Figure 4:
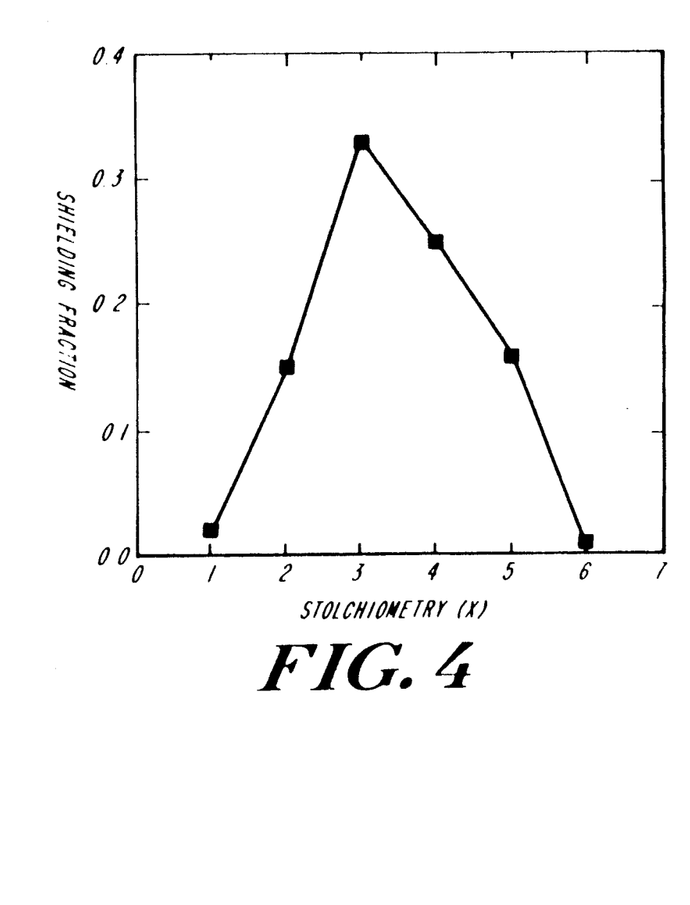
FIG. 4 is a plot showing the yield of superconducting fraction as a function of x in $Rb_xC_{60}$ powders, as determined from the diamagnetic shielding value at 5 K. The data points correspond to the maximum yield observed for each value of x after a reaction time of between 30 and 48 hours.

FIG. 3 shows temperature-dependent magnetic susceptibility measurements obtained from a (RbHg):$C_{60}$ 3:1 sample reacted at 200° C. Folowing completion of the reaction, metallic Hg was present in the reaction tube. The shielding (flux exclusion) curves obtained by cooling the sample in zero field to 5 K and then warming in a field of 50 Oe shows a clear transition near 28 K. The corresponding field cooled data exhibit strong flux expulsion from the sample (Meissner effect) below about 28 K.

A $T_c \approx 28$ K superconductor was obtained from a similar reaction of RbTl with $C_{60}$; pure Tl metal was present in the reaction tube following the reaction. Inasmuch as nearly the same $T_c$ is observed from $C_{60}$ reactions with Rb, RbHg, and RbTl, it appears that the identical superconducting phase is formed in all these reactions and that this phase corresponds to $Rb_xC_{60}$. This conclusion finds further support by analogy with the reactions, described above, of KM and CsM (M=Hg, Tl, Bi) with $C_{60}$ to form $K_3C_{60}$ and $Cs_3C_{60}$, respectively.

The superconducting fractions of the powder samples of $Rb_xC_{60}$ obtained by doping with RbHg (and RbTi) doping as described above are routinely in excess of 35%. Apparently Hg and Tl in an alloy with Rb faciliate the incorporation of Rb into the $C_{60}$ lattice to form the homogeneous bulk superconducting phase.

FIG. 2 shows the dependence of the yield of superconducting phase on the RbHg:$C_{60}$ ratio. The data shown in FIG. 2 were determined from the low-temperature shielding values, show that the maximum yield of superconducting fraction is obtained at a stoichiometry close to 3:1, strongly suggesting that the stoichiometry of the superconducting phase is $Rb_3C_{60}$, and thus the Rb-doped and the K-doped superconducting phases have the same stoichiometry.

The superconducting fraction of $Rb_xC_{60}$ can be increased at this optimum 3:1 stoichiometry in sintered pellets. More particularly, pressed and sintered pellets prepared generally as described in K. Holczer et al. (1991) from the $Rb_2C_{60}$ product exhibit low temperature diagmagnetic shielding signals that approach 100% of the theoretical value.

Figure 51:
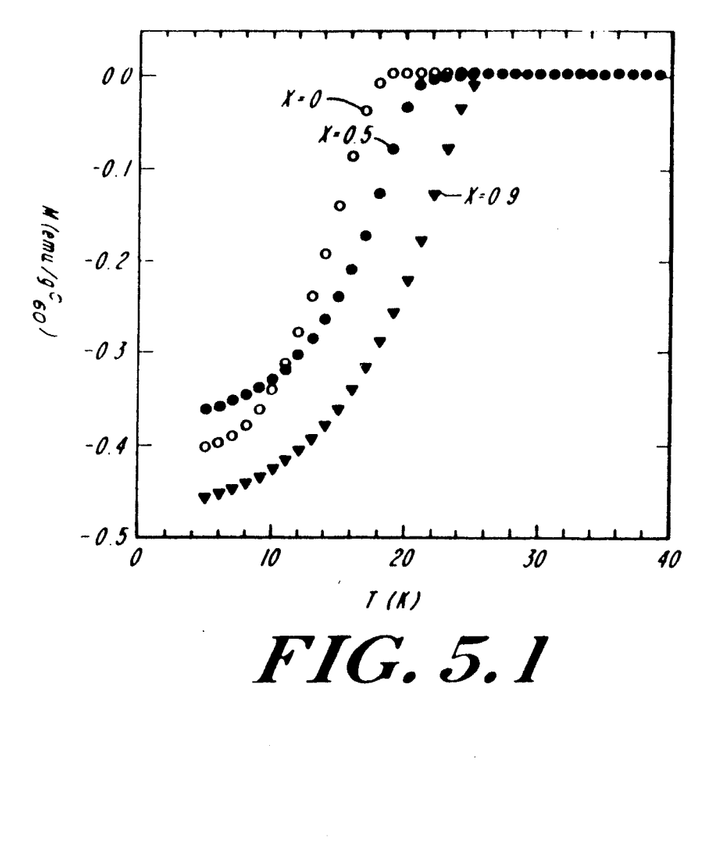
Figure 52:
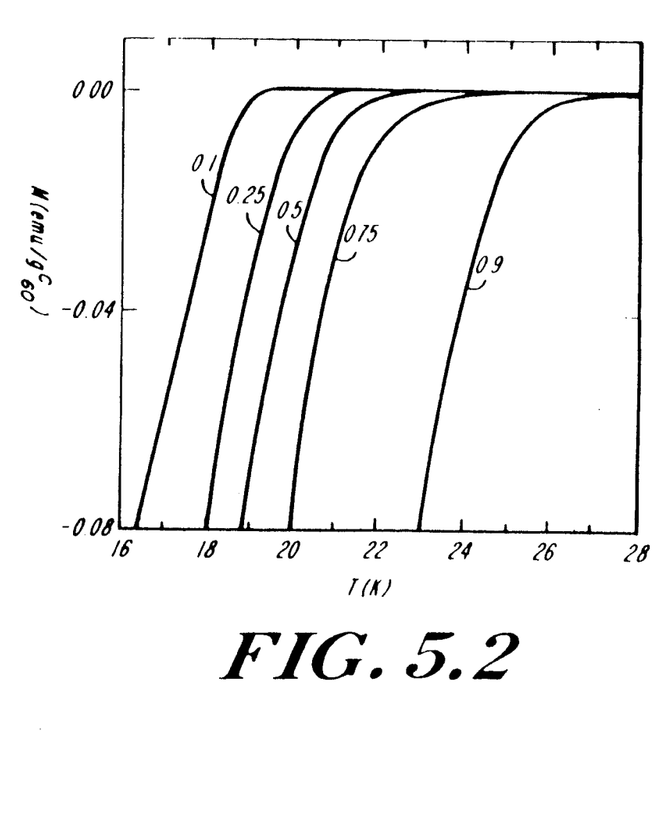

Single phase superconducting materials can be made by reaction of $Rb_xK_{1-x}Hg$ alloys with $C_{60}$ in a 3:1 ratio at 200° C. using protocols similar to those described above for $Rb_3C_{60}$. As FIG. 5 shows, such single phase superconducting $(Rb_xK_{1-x})_3C_{60}$ materials are produced in high yields as determined by magnetic susceptibility measurements. Analysis of the low temperature shielding values shown in FIG. 5 shows that the superconducting fractions (x=between 0 and 1) are at least 35% for powders; the superconducting fractions of sintered pellets approach 100%. The data in FIG. 5 show no evidence of phase separation (that is, distinct $K_3C_{60}$ and $Rb_3C_{60}$ domains are not formed within the sensitivity limits employed (about 0.1 volume %). Measurements recorded as a function of reaction time show further that the reaction rates for Rb and K intercalation into the $C_{60}$ are similar, as single phase materials are obtained for reaction times between 1 hour and 60 hours.

Moreover, the data of FIG. 5 show that $T_c$ increases systematically with increasing x. Only Rb and K are incorporated into the $C_{60}$ lattice in reactions of this kind (e.g., similar results obtain from reaction of $Rb_xK_{1-x}Tl$ with $C_{60}$ under similar conditions). The observed transition is therefore assignable to homogeneous, bulk $(Rb_xK_{1-x})_3C_{60}$ superconducting materials.

Figure 6:
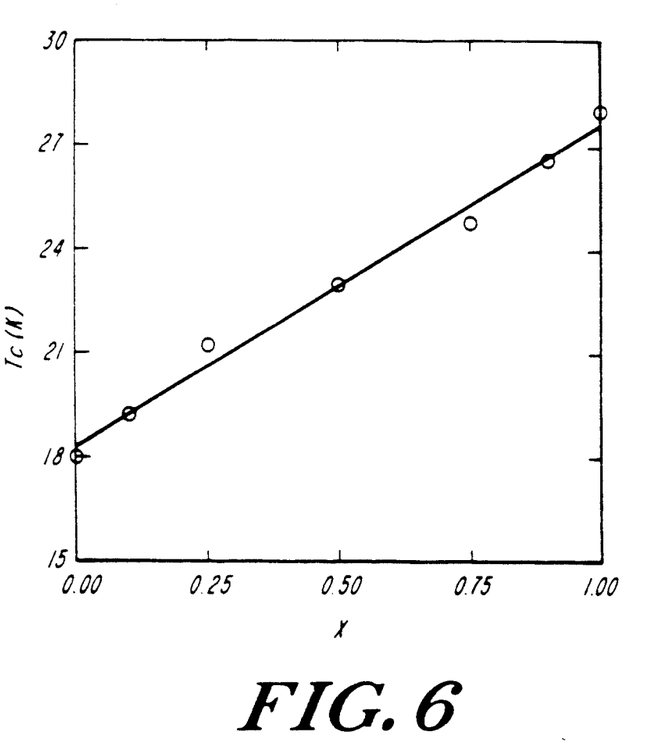
FIG. 6 is a plot showing $T_c$ as a function of the Rb:K ratio in $(Rb_xK_{1-x})_3C_{60}$ materials; uncertainty in the values of $T_c$ is $\pm 0.2°$ C.

In these single phase $(Rb_xK_{1-x})C_{60}$ materials $T_c$ increases nearly linearly with x, as summarized in FIG. 6. This shows mixed alkali metal intercalation. The apparent continuous change of $T_c$ with x in single phase materials shows that the Rb-doped and K-doped $C_{60}$ superconducting phases are isostructural, and there is apparently little preference between Rb and K occupying the sites (tetrahedral, octahedral) in the $C_{60}$ lattice. This suggests a chemical pressure effect. Particularly, as x is increased by substituting the larger Rb ion for K into the solid, the lattice expands and the coupling between adjacent $C_{60}$ molecules is reduced; that is, Rb creates a "negative" pressure. Recent studies of the effects of high hydrostatic pressure on $T_c$ in $K_3C_{60}$ show that compression of the lattice significantly decreases $T_c$, see, e.g., G. Sparn et al. (1991), *Science*, Vol. 252, pp. 1829-31. The sensitivity of the $T_c$ of doped $C_{60}$ to pressure, whether hydrostatic pressure or chemical pressure, as demonstrated here, is consistent with a sharply peaked band of electronic states at the Fermi-level whose width depends sensitively on the coupling between the $C_{60}$ molecules in the lattice.

In a comparison of $T_c$s in the various known alkali metal-doped fullerene high $T_c$ superconductor compositions, $T_c$ increases 10 K on going from K to Rb but only 1-2 K on going from Rb to Cs. This latter increase contrasts recent predictions for the $T_c$ of $Cs_xC_{60}$ of 47 K (based on the enhanced polarizability of Cs compared to the smaller alkali metals, J. C. Phillips et al., manuscript submitted to *Nature*) and 60 K (based on an extrapolation of the negative pressure dependence of $T_c$ determined for the K-doped superconducting phase, J. E. Schirber et al., *Physica C*, in the press).

Generally, within the context of the theory articulated by J. Bardeen et al. (1957), *Phys. Rev.*, Vol. 108, p. 1175 et seq: ["BCS theory"], $T_c$ can be expected to depend exponentially on the density of states at the Fermi level, N(Ef), and the effective electron coupling, $V_o$. If the K, Rb, and Cs superconducting phases are assumed to be isostructural, then doping of larger ions into the lattice would be expected to reduce $V_o$, but at the same time increase N(Ef) owing to a decreased interaction between $C_{60}$ clusters and narrowing of the conduction band.

Use

Alkali metal-doped superconductors according to the invention can be used, for example, in construction of superconductor/semiconductor heterostructures and superconductor/insulator/semiconductor heterostructures for application in electronic devices, and in particular in devices where high $T_c$ superconducting characteristic is desirable. The procedures as described above can be scaled up by well known techniques, and the resulting material can be applied, for example in a thin film, by conventional evaporation techniques, all as well known in the art.

OTHER EMBODIMENTS

Other embodiments are within the claims.

I claim:

1. A method for making a superconducting fullerene composition having the formula $(M)_x C_{60}$ wherein x is in the range between about 1.5 and about 3 and wherein M is one or more alkali metals, comprising reacting a $C_{60}$ fullerene with an alloy wherein said alloy is a binary alloy containing an alkali metal or a ternary alloy containing at least two different alkali metals.

2. The method of claim 1 wherein said binary alloy includes K, Rb, or Cs.

3. The method of claim 1 wherein said ternary alloy includes any two of K, Rb, or Cs.

4. The method of claim 1 wherein said alloy further includes one of Hg, Tl, or Bi.

5. The method of claim 1 wherein said alloy has the formula $M^1_y M^2_{1-y} M^3$, wherein $0 \leq y \leq 1$ and wherein each of $M^1$ and $M^2$ is an alkali metal.

6. The method of claim 5 wherein $y = 1$ and $M^1$ is one of K, Rb, or Cs.

7. The method of claim 5 wherein $y < 1$ and $M^1$ and $M^2$ are two of K, Rb, or Cs.

8. The method of claim 5 wherein $M^3$ is one of Hg, Tl, or Bi.

9. The method of claim 1 wherein x is about 3.

10. The method of claim 1 wherein said alloy is CsM, M being one of Hg, Tl, or Bi.

11. The method of claim 10 wherein said alloy is $CsHg_{1.1}$.

12. The method of claim 10 wherein said alloy is $CsTl_2$.

13. The method of claim 10 wherein said alloy is CsBi.

14. The method of claim 1 or 5 wherein said reacting step includes exposing a preparation comprising said fullerene with a vapor phase comprising said alloy.

15. The method of claim 1 or 5 wherein said reacting step includes exposing said fullerene preparation to said alloy for a time less than about 3 hours.

16. The method of claim 15 wherein said reacting step includes exposing said fullerene preparation to said alloy for a time in the range between about 1 hour and about 3 hours.

* * * * *

UNITED STATES PATENT AND TRADEMARK OFFICE
CERTIFICATE OF CORRECTION

PATENT NO. : 5,196,396

DATED : March 23, 1993

INVENTOR(S) : Charles M. Lieber

It is certified that error appears in the above-indentified patent and that said Letters Patent is hereby corrected as shown below:

Column 1, line 29: after "66" please insert -- , --;

Column 1, line 66: delete "fullerine" and insert therefor -- fullerene --;

Column 5, line 63: delete "diagmagnetic" and insert therefor -- diamagnetic --; and Column 6, line 24: delete "$(Rb_xK_{1-x})$" and insert therefor -- $(Rb_xK_{1-x})_3$ --.

Signed and Sealed this

Eighth Day of March, 1994

Attest:

BRUCE LEHMAN

Attesting Officer    Commissioner of Patents and Trademarks